US012683592B2

(12) United States Patent
Lin et al.

(10) Patent No.: US 12,683,592 B2
(45) Date of Patent: Jul. 14, 2026

(54) PHASE INTERPOLATOR LAYOUT

(71) Applicant: Taiwan Semiconductor Manufacturing Company, Ltd., Hsinchu (TW)

(72) Inventors: Wei Shuo Lin, Hsinchu (TW); Wei Chih Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 124 days.

(21) Appl. No.: 18/635,102

(22) Filed: Apr. 15, 2024

(65) Prior Publication Data

US 2025/0323634 A1 Oct. 16, 2025

(51) Int. Cl.
*H04L 7/00* (2006.01)
*H03K 5/135* (2006.01)
*H03K 19/173* (2006.01)
*H03K 5/00* (2006.01)

(52) U.S. Cl.
CPC ......... *H03K 5/135* (2013.01); *H03K 19/1737* (2013.01); *H03K 2005/00286* (2013.01)

(58) Field of Classification Search
CPC .............. H03K 5/135; H03K 19/1737; H03K 2005/00286
USPC ........................................................ 375/355
See application file for complete search history.

(56) References Cited

U.S. PATENT DOCUMENTS

| | | | |
|---|---|---|---|
| 9,160,345 B1 | 10/2015 | Gorecki | |
| 10,128,827 B1 * | 11/2018 | Quek ..................... | H03K 5/135 |
| 10,171,091 B2 | 1/2019 | Song et al. | |
| 10,333,533 B1 | 6/2019 | Moscone | |
| 10,367,634 B1 | 7/2019 | Yu | |
| 11,849,015 B1 | 12/2023 | Zhao et al. | |
| 2003/0123589 A1 * | 7/2003 | Glenn ..................... | H04L 7/033 |
| | | | 375/354 |
| 2004/0212416 A1 * | 10/2004 | Buchwald ............. | H04L 7/0274 |
| | | | 327/248 |
| 2023/0299751 A1 * | 9/2023 | Bal ..................... | H03H 17/0275 |
| | | | 708/313 |

FOREIGN PATENT DOCUMENTS

TW 1672035 B 9/2019

OTHER PUBLICATIONS

Taiwan Office Action; Application No. 113121928; Dated Jan. 14, 2025.

* cited by examiner

*Primary Examiner* — Helene E Tayong
(74) *Attorney, Agent, or Firm* — Jones Day

(57) ABSTRACT

Circuits, devices, and methods relating to a phase interpolator are described herein. The phase interpolator may include a first plurality of functional units and a second plurality of functional units, and may be controlled, in part, by an encoding scheme. The phase interpolator may be designed to have a layout such that a turn-on resistance across the first plurality of functional units in response to a first code of the encoding scheme is equal to a turn-on resistance across the second plurality of functional units in response to a second code of the encoding scheme.

20 Claims, 16 Drawing Sheets

250

| CT code (Gray code) | MUXA | MUXB | FT code (A) | FT code (B) |
|---|---|---|---|---|
| 000 | PH0 | PH30 | 31→0 | 0→31 |
| 001 | PH60 | PH90 | 0→31 | 31→0 |
| 011 | PH120 | PH150 | 31→0 | 0→31 |
| 010 | PH180 | PH210 | 0→31 | 31→0 |
| 110 | PH240 | PH270 | 31→0 | 0→31 |
| 100 | PH300 | PH330 | 0→31 | 31→0 |

260

481

483

725

Step Size vs. Code

| | MAX(ps) | Min (ps) | Ratio |
|------|---------|----------|-------|
| X3 | 0.076 | 1.035 | 7.35 |
| X2 | 0.0699 | 0.97 | 7.18 |
| X1 | 0.0688 | 1.028 | 6.69 |

730

PHASE INTERPOLATOR LAYOUT

BACKGROUND

A phase interpolator is an electronic circuit used to generate an output signal characterized by an intermediate phase that lies between the phases of two input signals. In certain high-speed communication systems such as a high-speed serial link, phase interpolators may be used to adjust the sampling phase of received data, thereby enabling clock and data recovery.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2A is a circuit diagram depicting a phase interpolator according to an embodiment, FIG. 2B is a table depicting an encoding scheme for a phase interpolator according to an embodiment, FIG. 2C is a graph depicting the relationship between phase shift and an encoding scheme of the phase interpolator according to an embodiment, and FIG. 2D is a signal diagram depicting a phase change of signals caused by a phase interpolator according to an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
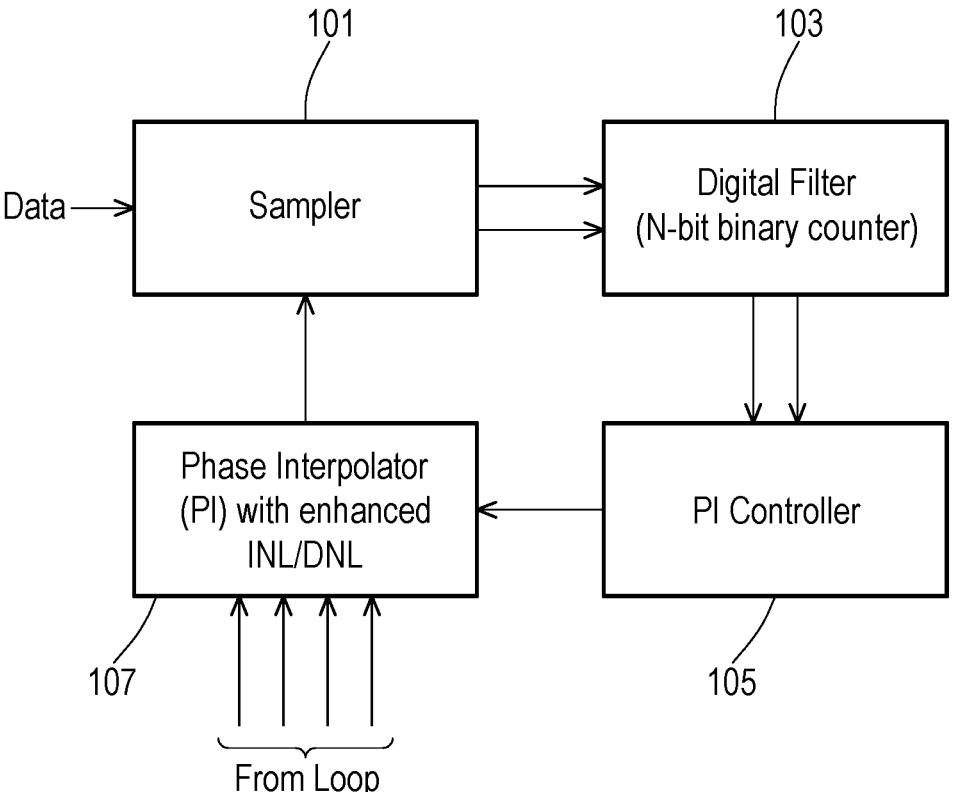
FIG. 1 is a circuit diagram depicting a phase interpolator based clock and data recovery circuit (PI-based CDR) according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the circuit. Some of the features described below can be replaced or eliminated for different embodiments. Although some embodiments are discussed with operations performed in a particular order, these operations may be performed in another logical order.

As described above, high-speed communication systems, including high-speed serial links, may employ a phase interpolator to adjust a signal phase and enable clock and data recovery. In some circuit designs, a phase interpolator may comprise two inverters having different driving capabilities in order to generate different phase outputs. This structure may exhibit improved power consumption and good area characteristics, but generally has a corresponding drawback in both integral non-linearity (INL), which measures the deviation of the output signal from an ideal straight line, and differential non-linearity (DNL), which measures the difference between a measured step size of the interpolator as compared to a desired step size. Sub-optimal INL and DNL characteristics may result in inconsistent output and inaccuracies. Accordingly, there is desire for a phase interpolator design that achieves the improved power consumption and area of an inverter-based design while mitigating the degradation of the INL and DNL characteristics.

Embodiments described herein relate to phase interpolators with balanced INL and DNL trends. In some embodiments, a phase interpolator may comprise a particular layout that enables this improved INL and DNL performance. Additionally, phase interpolators describe herein may comprise a bleeder path that may lead to improved INL and DNL performance and protect against the occurrence of non-monotonic phenomena. The improved INL and DNL performance provided by embodiments described herein may lead to more accurate phase interpolation and improved data recovery characteristics.

FIG. 1 is a circuit diagram depicting a phase interpolator based clock and data recovery circuit (PI-based CDR)

according to an embodiment. The circuit may be configured to recover data from an input data signal. The circuit may comprise a feedback loop in which a phase interpolator 107, a sampler 101, a digital filter 103 and a phase interpolator controller (PI controller) 105 are connected in a loop in order to recover the data from the input data signal. The PI-based CDR may be fabricated as a discrete integrated circuit, device, or chip. Alternatively, the PI-based CDR may be circuit within a greater integrated circuit, device, chip.

In an embodiment, the sampler 101 may receive the input data signal. The sampler 101 may be configured to sample this input data signal, capture data at certain points, and output sampled signals to the digital filter 103. The points of sampling may be informed by signals supplied to the sampler 101 from the phase interpolator 107. The digital filter 103 may comprise, for example, an N-bit binary counter. The digital filter may be configured to pass on signals to a PI controller 105. The PI controller 105 may use the signals received from the digital filter 103 to generate control signals for adjusting the phase interpolator 107. Based on the control signals received from the PI controller 105 and signals received from a reference loop, the phase interpolator 107 provides clock signals that may be used in the recovery of data from the input data signal. The reference loop may comprise, for example, a phase-locked loop (PLL) or delay-locked loop (DLL).

According to embodiments described herein, the phase interpolator 107 may comprise an inverter-based phase interpolator demonstrating good power consumption characteristics and comprising a reduced area footprint as compared to other PI structures. Additionally, the phase interpolator 107 may comprise a layout configured to improve the INL and DNL characteristics of the output signal. For example, and as described in greater detail below, phase interpolator 107 may comprise a specific layout and/or a bleeder path leading to balanced INL/DNL trends across changing phase inputs.

Figures 2A, 2B:
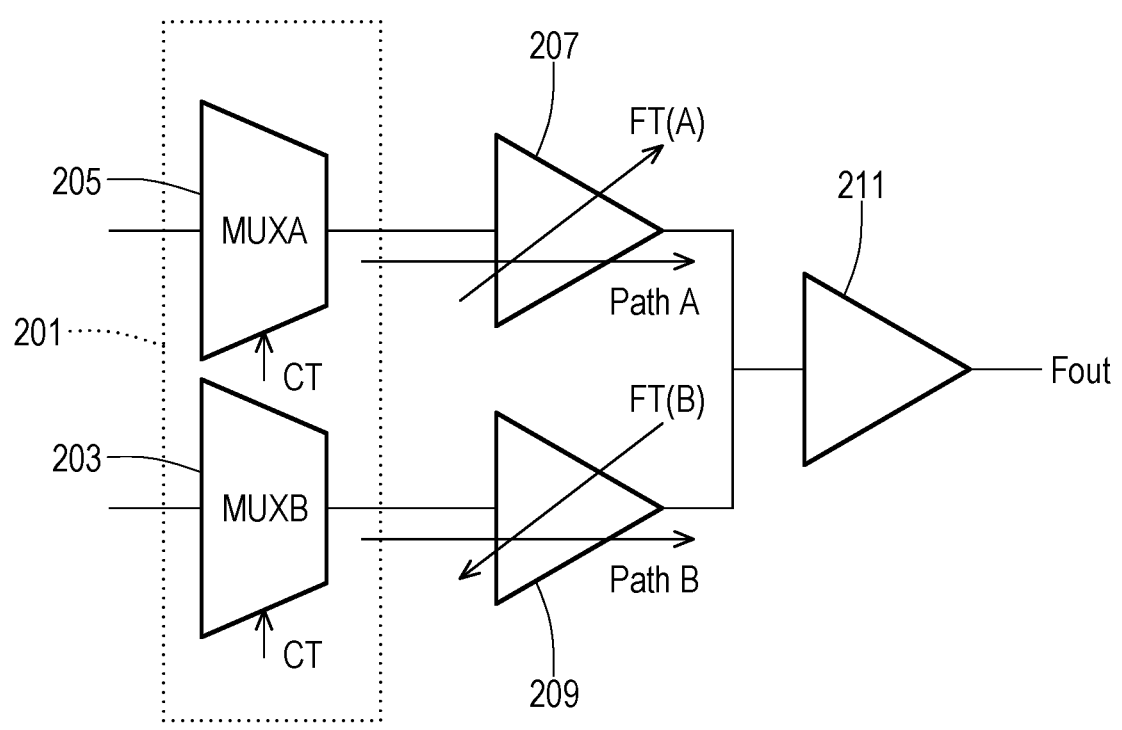
FIGS. 2A-2D are diagrams relating to a phase interpolator according to an embodiment.
Figure 2C:
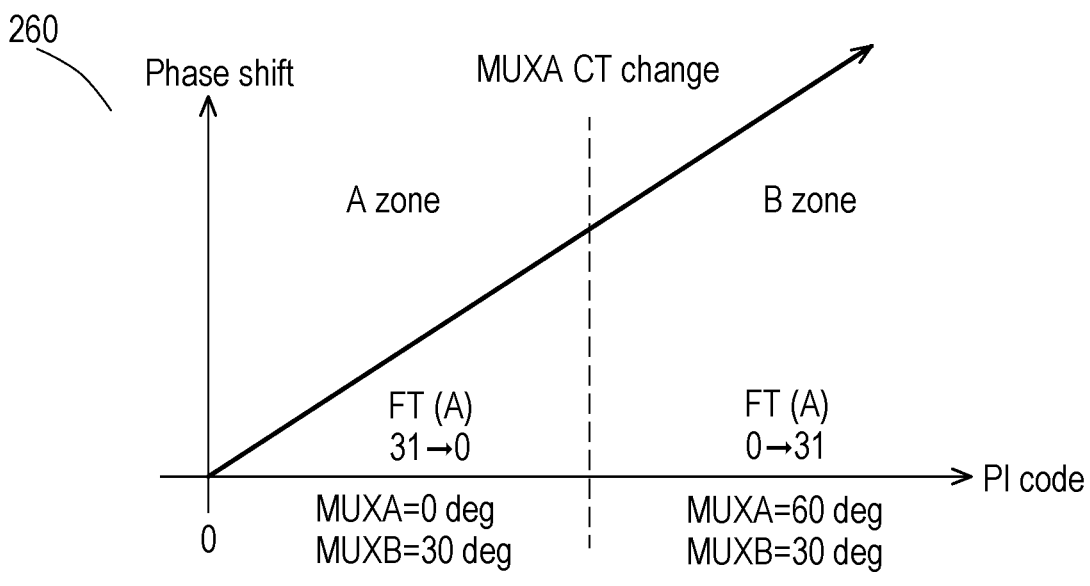
Figure 2D:
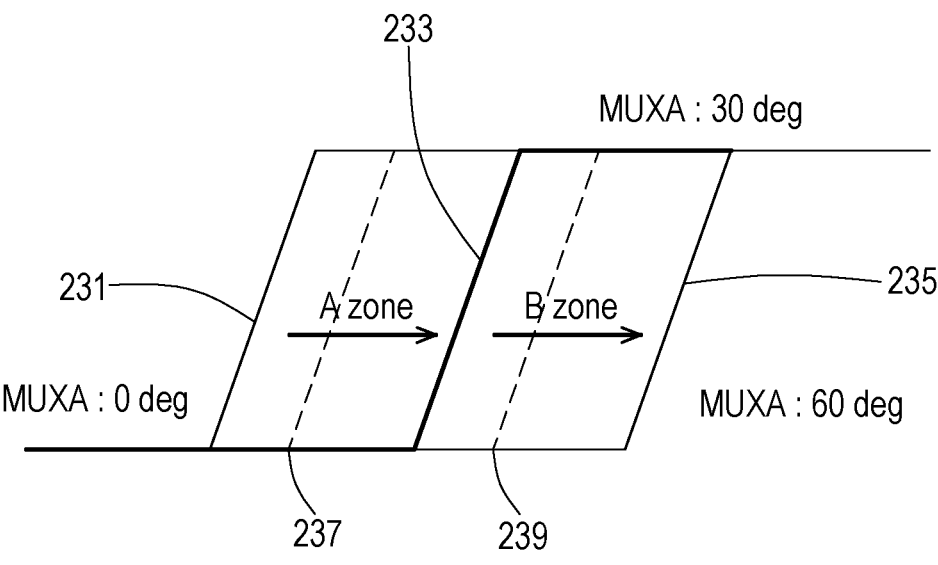

FIGS. 2A-2D are related to a phase interpolator according to an embodiment. FIG. 2A is a circuit diagram depicting a phase interpolator according to an embodiment, FIG. 2B is a table depicting an encoding scheme for a phase interpolator according to an embodiment, FIG. 2C is a graph depicting the relationship between phase shift and an encoding scheme of the phase interpolator according to an embodiment, and FIG. 2D is a signal diagram depicting a phase change of signals caused by a phase interpolator according to an embodiment.

As shown in FIG. 2A, the phase interpolator may comprise two signal paths, Path A and Path B. The phase interpolator may be configured to interpolate the phases of a signal on Path A and a signal on Path B such that the interpolator outputs a signal Fout having a phase between the signal traveling along Path A and the signal travelling along Path B.

The phase interpolator may comprise a plurality of multiplexers 201. The plurality of multiplexers may comprise a first multiplexer 205 (MUXA) positioned along Path A and a second multiplexer 203 (MUXB) positioned along Path B. In an embodiment, multiplexers MUXA and MUXB may comprise 6-to-1 multiplexers configured to receive six inputs and generate a corresponding output. As described in greater detail below with respect to FIG. 2B, inputs to MUXA and MUXB may comprise a coarse tune (CT) code having six different states. The CT code may comprise a gray code that provides a monotonic change in phase shift in response to changes in the CT code. While an embodiment comprising 6-to-1 multiplexers is described, it is noted that circuits, methods, and devices described herein are not so limited, and can comprise multiplexers and encoding schemes having different numbers of inputs and codes.

Depending upon the CT code, each of MUXA and MUXB may generate an output signal that imposes a particular phase shift upon the input signal. These output coarse-tuned signals may travel along Path A and Path B respectively to a first inverter array 207 along Path A and a second inverter array 209 along Path B. Inverter arrays 207 and 209 may provide fine tuning to the signals along each path. The combination of coarse tuning and fine tuning may allow for greater resolution of the phase interpolator and, consequently, more accurate clock and data recovery. In an embodiment, each inverter array may comprise 32 functional units which can be turned on and off individually. This may provide 32 fine tune increments, each of which imparts a different degree of phase shift to input signals. The fine tune increments provide smaller steps of phase shift within each coarse tune increment allowing for greater overall control of the phase shift.

The signals that are output from inverter arrays 207 and 209 may travel along Path A and Path B, respectively, and may be combined to generate a signal $PI_{OUT}$ that may be taken as input by an output inverter 211. The output inverter may then generate an output signal $F_{OUT}$ that has a phase between the phase of the signal passed on from MUXA along Path A and the signal passed on from MUXB along Path B.

FIG. 2B is a table depicting an encoding scheme for a phase interpolator according to an embodiment. The table 250 depicts an encoding scheme for a 12-phase phase interpolator and charts the CT code of the encoding scheme against corresponding phase shift imparted by MUXA and MUXB. Table 250 also depicts the manner in which the fine tune code (FT code) changes in order to impart incremental phase shifts smaller than those imparted by a change in the CT code. The CT code may comprise six codes using a binary gray code scheme.

In an embodiment, a CT code of 000 and FT code of 31 may describe an initial condition of the phase interpolator. In operation, the CT code 000 may control MUXA and MUXB and may specify a phase shift of 0 degrees for MUXA and a phase shift of 30 degrees for MUXB. Phase interpolators according to embodiments herein may then use fine tuning to arrive at a particular output phase Fout. For example, where the initial FT code is 31, the inverters along Path A may turned on whereas the inverters along Path B are turned off. This may correspond to an output signal having a phase shift in line with the phase shift of MUXA. To change the phase of output signal Fout, the FT code through Path A may decrement from 31 to 0. As the FT code shifts in this manner, Fout may shift to be more in line with the output from MUXB. Each discrete change in the fine tune code may change the relative strengths of the contribution to Fout of the output along Path A vs. that of Path B. As the FT code shifts from 31 to 0, the contribution of Path A may weaken, while the contribution of Path B may strengthen by a corresponding offset.

This relationship may be shown mathematically. In an embodiment, each array may comprise 32 functional units. The total number of functional units in an on-state at each fine tune code may be equal to 32 and the number of "on" functional units along each path may be determined by the fine tune code. For example if 30 units along Path are in an on-state, then 2 units along Path B may be in an on-state. While embodiments showing 32 functional units along each path are shown and described, phase interpolators according to embodiments are not so limited. For example, each path may have N number of functional units. A number of functional units may be in an on-state along Path A and B number of functional units may be in an on-state along Path B, so long as the relationship A+B=N is satisfied.

In operation, this may allow for the phase of Fout to change by small, fine-tuned increments. For example, as described above and shown in table 250, the initial state of the phase interpolator may be characterized by a CT code of 000 for both MUXA and MUXB and an initial FT code through Path A of 31. The CT code of 000 may correspond to a 0 degree phase shift through MUXA and a 30 degree phase shift for MUXB. The initial FT code may cause Fout to be weighted entirely toward Path A, resulting in a 0 degree phase shift.

As the FT code decreases from 31 to 0 through Path A, the balance may shift toward path B, and when the FT code is 0 through Path A, Fout may be weighted entirely toward Path B, resulting a 30 degree phase shift. To continue on to greater phase shifts, the CT code may be altered. In an embodiment, the CT code of MUXA is first incremented up, while the CT code of MUXB remains the same. As shown in Table 250, the next CT code for MUXA may impart a 60 degree phase shift. Accordingly, at this point, the phase interpolator may shift between the 30 degree phase shift of MUXB (at CT code 000) and the 60 degree phase shift of MUXA (at CT code 001). To increase the phase shift from 30 degrees toward 60 degrees, the FT code may be altered in order to shift the weighted average from entirely on the Path B side back toward Path A.

This shift is shown in greater detail with respect to FIG. 2C, which is a graph 260 depicting a phase shift of Fout as a function of the phase interpolator code (PI code). In an embodiment, the initial condition having a CT code of 000 for both MUXA and MUXB and a FT code of 31 for Path A may result in a 0 degree phase shift. As the FT code decreases from 31 to 0, the phase shift may increase toward the MUXB phase shift value of 30 degrees. This increase is shown in the region "A zone" of FIG. 2C.

In an embodiment, when the fine tune code reaches 0 for Path A (FT (A)=0, as shown in FIG. 2C), the phase shift of Fout may be aligned with the phase shift of MUXB, which may be 30 degrees. To reach greater phase shifts, the coarse tune of MUXA may be incremented, as indicated by the vertical dashed line. The FT code then increments back from 0 to 31 in order to increase the phase shift from the 30 degree phase shift corresponding to the phase shift of MUXB, to the 60 degree phase shift corresponding to the phase shift of MUXA. This increase is shown in the region "B zone" of FIG. 2C. The phase shift across the A zone and B zone is described in greater detail below with reference to FIG. 2D.

FIG. 2D is a signal diagram depicting a phase change of signals caused by a phase interpolator according to an embodiment. FIG. 2D shows how the phase shift of an output signal Fout may change according to the coarse tune and fine tune of the phase interpolator. In an embodiment, a first encoding scheme for example a CT code of 000 and a FT code through Path A of 31, may result in the 0 degree phase shift shown as 231. At this code, MUXA may control the phase of the output signal $F_{OUT}$. As the FT code changes across the A zone, as described above with reference to FIG. 2C, control of the output signal may shift from MUXA to MUXB. This may result in a 30 degree phase shift, shown as 233, when the FT code through Path A reaches 0. FT codes between 31 and 0 may result in intermediate phase shifts, such as that shown as 237.

For phase shifts greater than 30 degrees, the encoding scheme may increment the coarse tune of for MUXA, which may result in a phase shift of MUXA of 60 degrees. Phase shifts between 30 degrees and 60 degrees are obtained by incrementing the FT code through Path A back from 0 to 31. These phase shifts are represented in the B zone, as described above with reference to FIG. 2C. By incrementing the FT code in this manner, control of the output signal may shift back from MUXB to MUXA. This may result in a 60 degree phase shift, as shown as 235, when the FT code through Path A reaches 31. FT codes between 0 and 31 may result in intermediate phase shifts, such as that shown as 239.

To obtain greater phase shifts beyond 60 degrees, this pattern may continue in the matter shown in table 250 of FIG. 2B. For example, after the FT code shifts all the way back toward MUXA, resulting in a phase shift of 60 degrees, the coarse tune of MUXB can be incremented while leaving the CT code of MUXA the same. This may result in the phase interpolator outputting a signal Fout having a phase between 60 degrees (at FT code 31) and 90 degrees (at FT code 0). By exhausting all CT code phases, the encoding scheme according to embodiments described herein may provide incremental phase tuning for the entire spectrum from a 0 degree phase shift to a 360 degree phase shift. Circuit implementations of this encoding scheme are described in greater detail below with respect to FIGS. 3A-3B.

Figure 3A:
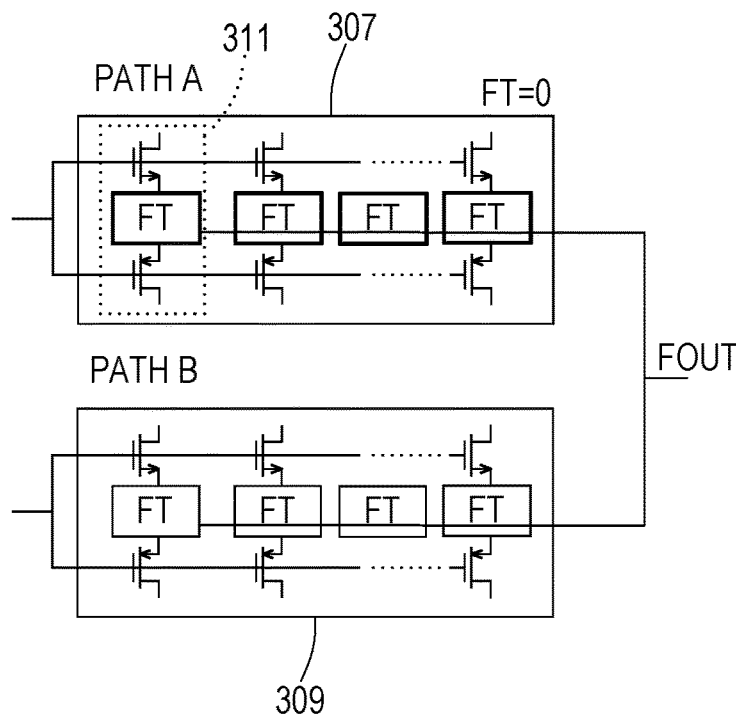
FIG. 3A and FIG. 3B are circuit diagrams depicting a phase interpolator according to an embodiment.
Figure 3B:
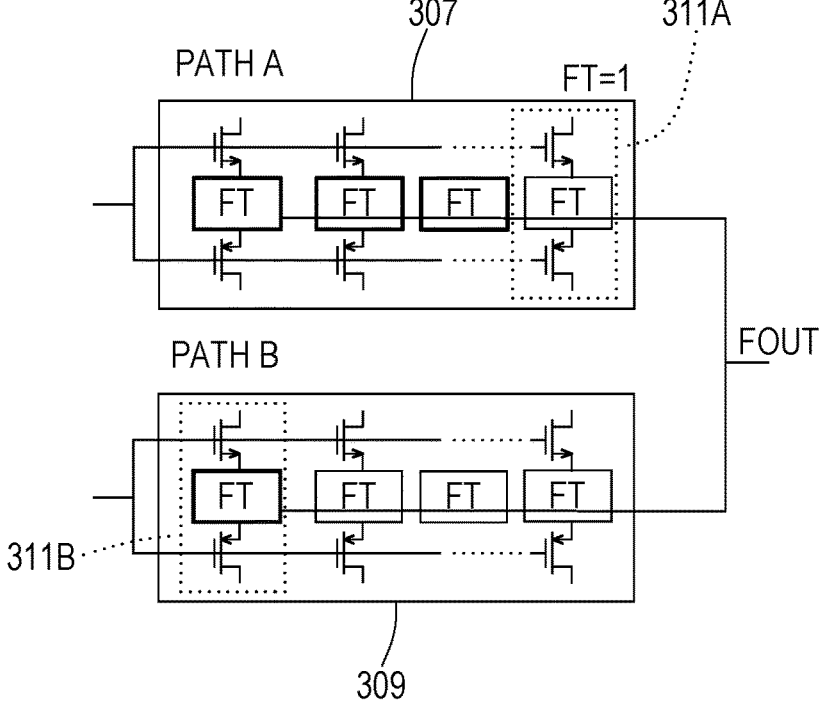

FIGS. 3A-3B are circuit diagrams depicting a phase interpolator according to an embodiment. Specifically, FIGS. 3A and 3B depict inverters along Path A and Path B of a phase interpolator according to an embodiment. FIG. 3A is a circuit diagram depicting inverter array 307 along Path A and inverter array 309 along Path B, under the condition that the FT code=0. FIG. 3B is a circuit diagram depicting inverter array 307 along Path A and inverter array 309 along Path B under the condition that the FT code=1. Each inverter array may comprises a plurality of functional units 311 comprising an inverter structure and being configured to receive a fine tune signal FT. Each functional unit may comprise transistors arranged to form an inverter as well as other components such as resistors in order to introduce a specified phase change when in an on state. In an embodiment, each path may comprise 32 functional units, numbered from 0 to 31. This may provide for 32 discrete fine-tuned phases within each coarse tune.

The fine tune signal may control how many inverters in each array are turned on. For example, in FIG. 3A the code FT=0 may result in none of the functional units inverter array 307 along Path A being turned on. The code FT=0 may correspondingly result in all 32 functional units of the inverter array 309 along Path B being turned on. Accordingly at FT=0, the output signal $F_{OUT}$ is weighted entirely toward the output of inverter array 309 along Path B.

To generate a different phase change, the fine tune code may be altered, turning some functional units along Path A on, while turning a corresponding number of functional units along Path B off. For example, FIG. 3B depicts a scenario in which FT=1. This code may result in a single functional unit 311A of the inverter array 307 turning on, while a single functional unit 311B of the inverter array 309 turns off. This may change the weighted average of the output signal to be shifted slightly toward the signal of Path A. Each increment of the fine tune between toward FT=1 may result in another functional unit along Path A turning on with a corresponding turning off of a functional unit along Path B.

In embodiments described herein, each increment or decrement of the fine tune code may result in an accurate and evenly spaced phase change. Embodiments described herein may also incorporate layout and design features that provide for more control and accuracy of the spacing between for increments and decrements of the CT code. This may result in better INL and DNL characteristics and, consequently, improved CDR.

In particular, these results may be achieved by through a design of the floorplan and layout of a phase interpolator. The process of generating such a floorplan may occur during an IC design phase of the phase interpolator, or of an integrated circuit or device incorporating the phase interpolator. To generate a desired floorplan and layout, a designer may generate an initial design which may be received by software design tools such as electronic design automation (EDA) or computer aided design (CAD) tools. The designer may use these tools to generate an optimized floorplan and design layout to increase performance of the phase interpolator. Following successful design and testing, an integrated circuit may be fabricated based on this layout.

Figure 4A:
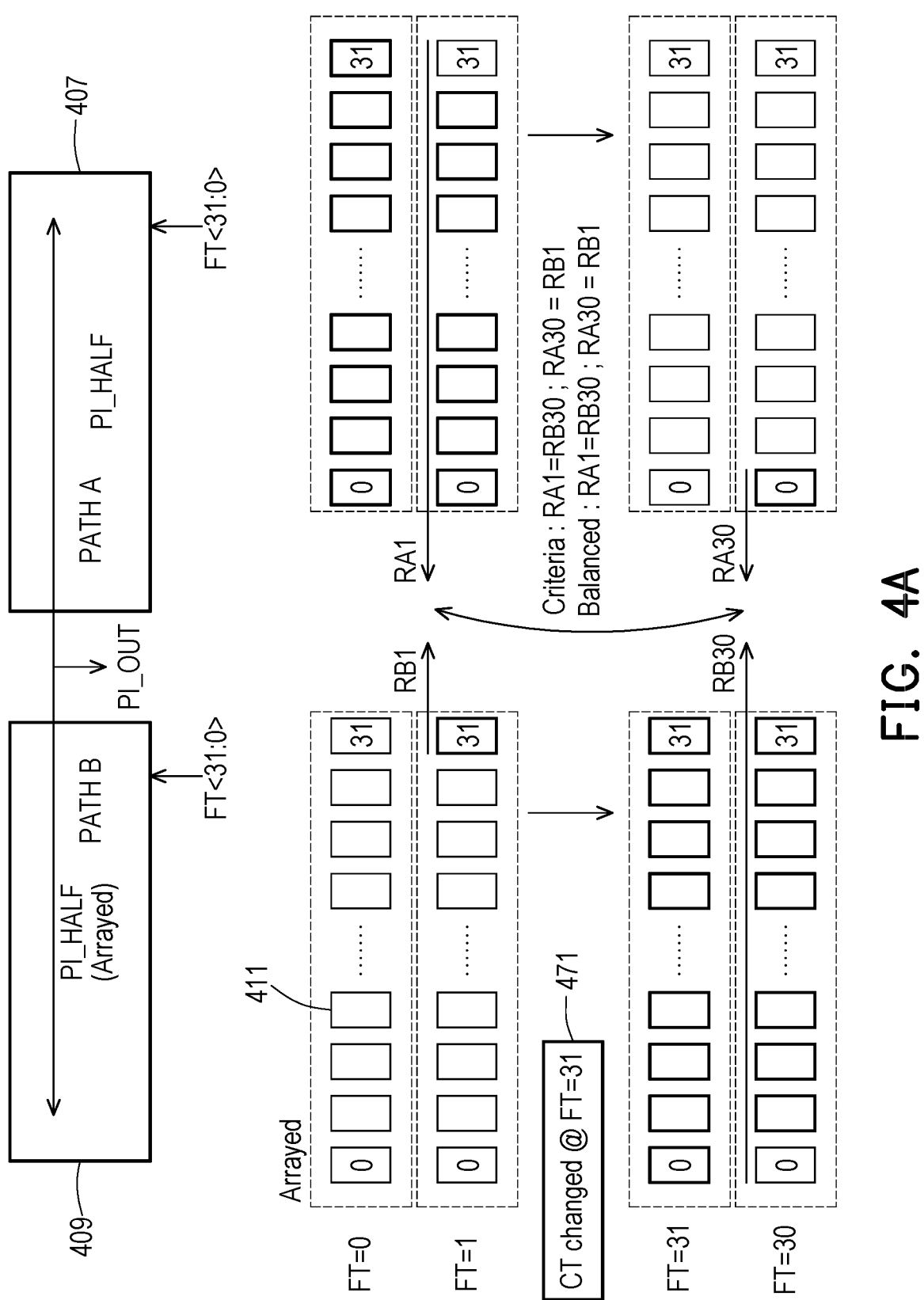
FIG. 4A and FIG. 4B are a schematic diagram depicting a layout of a phase interpolator according to an embodiment and graphs depicting the performance of a phase interpolator according to an embodiment.

FIG. 4A is a schematic diagram depicting a layout of a phase interpolator according to an embodiment. The phase interpolator may comprise an arrayed layout such that an array of functional units 407 along Path A is arranged on one side of the layout and an array of functional units 409 along Path B is arranged on the other side of the layout. Each array 407/409 may comprise a plurality of functional units 411 and each array receive a fine tune code FT<31:0>, which, during operation, may dictate the number of functional units 411 which are turned on in each array. The arrays of functional units 407/409 may comprise inverter arrays as described above with reference to FIGS. 2A-3B.

The layout may comprise splitting the functional units 411 of the phase interpolator into two halves, with one half along Path A and one half along Path B. For example, a first plurality of functional units may be arranged in a first array 407 comprising a first ordered arrangement of the individual functional units 411. A second plurality of functional units may be arranged in a second array 409 comprising a second ordered arrangement of the individual functional 411 units therein.

Each array of functional units may generate an output signal having a phase determined by the encoding scheme, and these output signals may combine to form a $PI_{OUT}$ signal. The phase interpolator may further comprise an output inverter that takes $PI_{OUT}$ as an input signal and outputs a final, interpolated output signal Fout.

In an embodiment, the layout of the functional units within each array may be determined such that Path A and Path B have balanced turn-on resistance values FT=1 and FT=30. Doing so may provide more even step sizes for coarse tune increments and decrements, thereby improving INL and DNL characteristics. This may be accomplished by arranging the functional units, numbered 0-31 in such a way to balance and optimize the turn-on resistances across Path A and Path B. In particular, the turn-on resistance across Path A and Path B may be balanced such that the turn-on resistance across Path A at FT=1 (RA1) matches that of the turn-on resistance across Path B at FT=30 (RB30), and the turn-on resistance across path A at FT=30 matches that of the turn-on resistance across Path B at F=1.

In an embodiment, the functional units of functional unit array 407 and functional unit array 409 may comprise an arrayed layout, meaning units 0-31 are arranged in a matching order, as shown in FIG. 4A. Accordingly, the phase interpolator may be configured such that when a fine tune adjustment causes a particular functional unit of functional unit array 407 to change its state, a corresponding change may happen to a same functional unit of inverter array 409. For example, a change from FT=0 to FT=1 will cause functional unit 31 of inverter array 409 to turn on, and cause functional unit 31 of inverter array 407 to turn off.

In an embodiment, fine tune codes FT=1 and FT=0 may represent the first fine tunes after a coarse tune increment or decrement. For example, in the encoding scheme described above with respect to FIGS. 2A-3B, the fine tune code may increment from 0 to 31 at which point a coarse tune adjustment is implemented as shown at 471. To continue the trend, the fine tune code then changes from 31 back to 0 starting with FT=30 as the first fine tune code after a coarse tune adjustment. The fine tune code may then decrease back to 0 before another coarse tune adjustment is implemented, and the next fine tune code in line may be FT=1. Balancing the turn-on resistances such that RA1=RB30 and RA30=RB 1, may provide a more symmetric step size for each coarse tune adjustment.

Figure 4B:
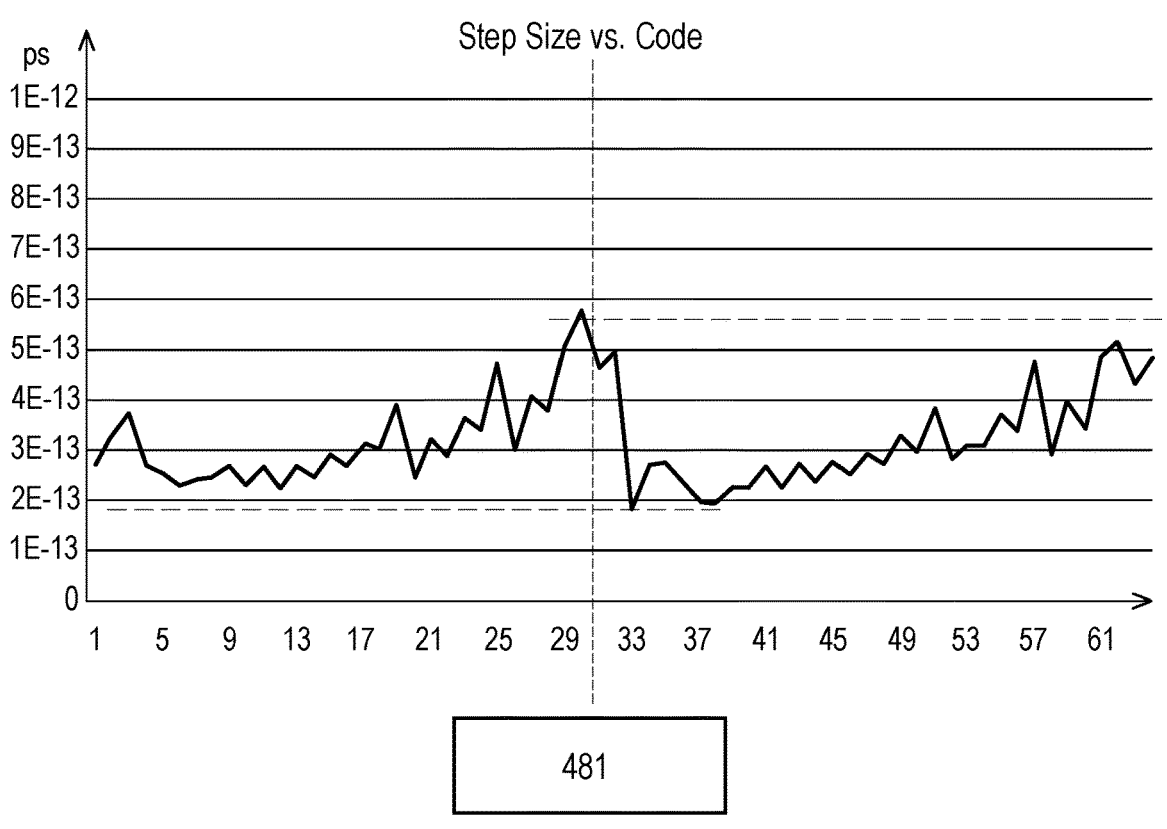
Figure 4B:
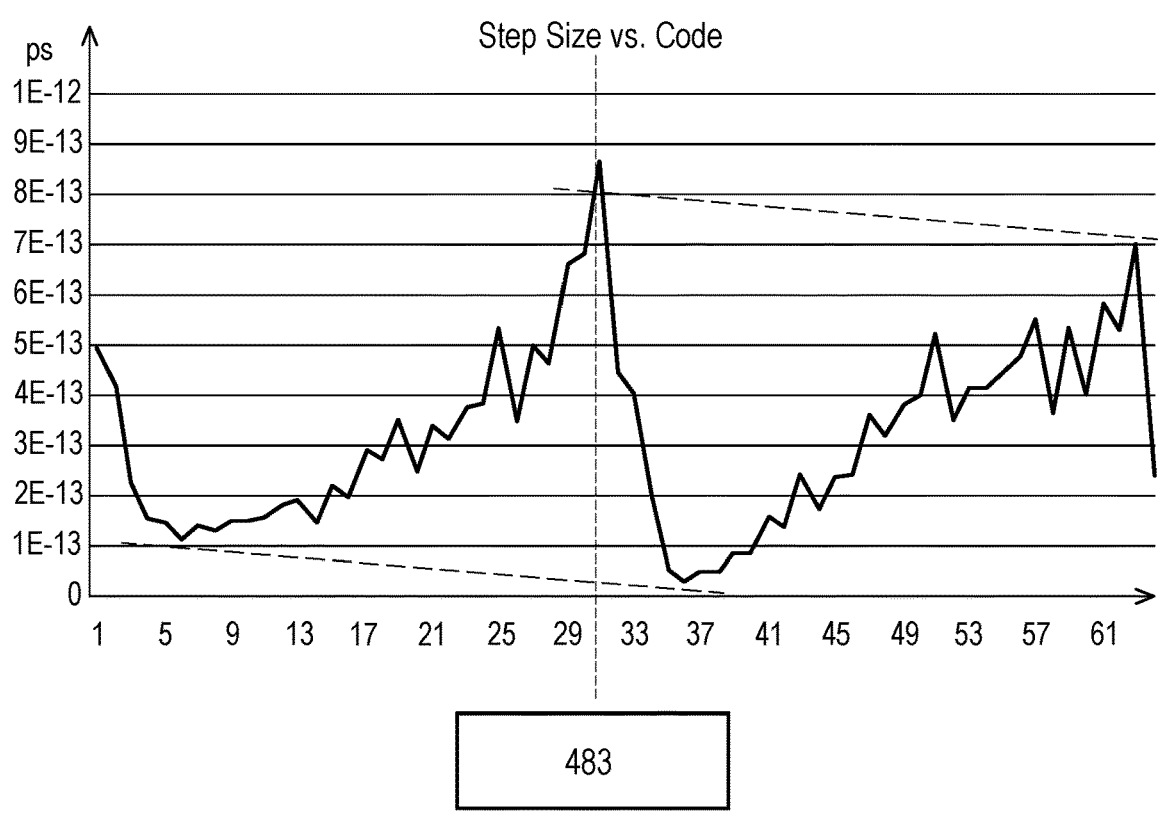

This improvement is shown in FIG. 4B, which depicts a first graph 481 showing a step size vs. a PI encoding scheme according to embodiments described herein comprising an arrayed layout, as compared to a second graph 483 depicting step size vs. encoding scheme for a phase interpolator not incorporating an arrayed layout.

The vertical dashed line in graphs 481 and 483 indicates the coarse tune adjustment that may be provided by an encoding scheme after 31 fine tune adjustment. Due to the arrayed layout of the phase interpolator of graph 481, peak values and minimum values are consistent across coarse tune adjustments. In contrast, the phase interpolator of graph 483, which may not incorporate such an arrayed layout, suffers from different peak values and different minimum values across different coarse tunes. This may lead to variations in how evenly spaced output phases of the phase interpolator are, which can negatively impact INL, DNL, and the accuracy of the phase interpolator.

Figure 5:
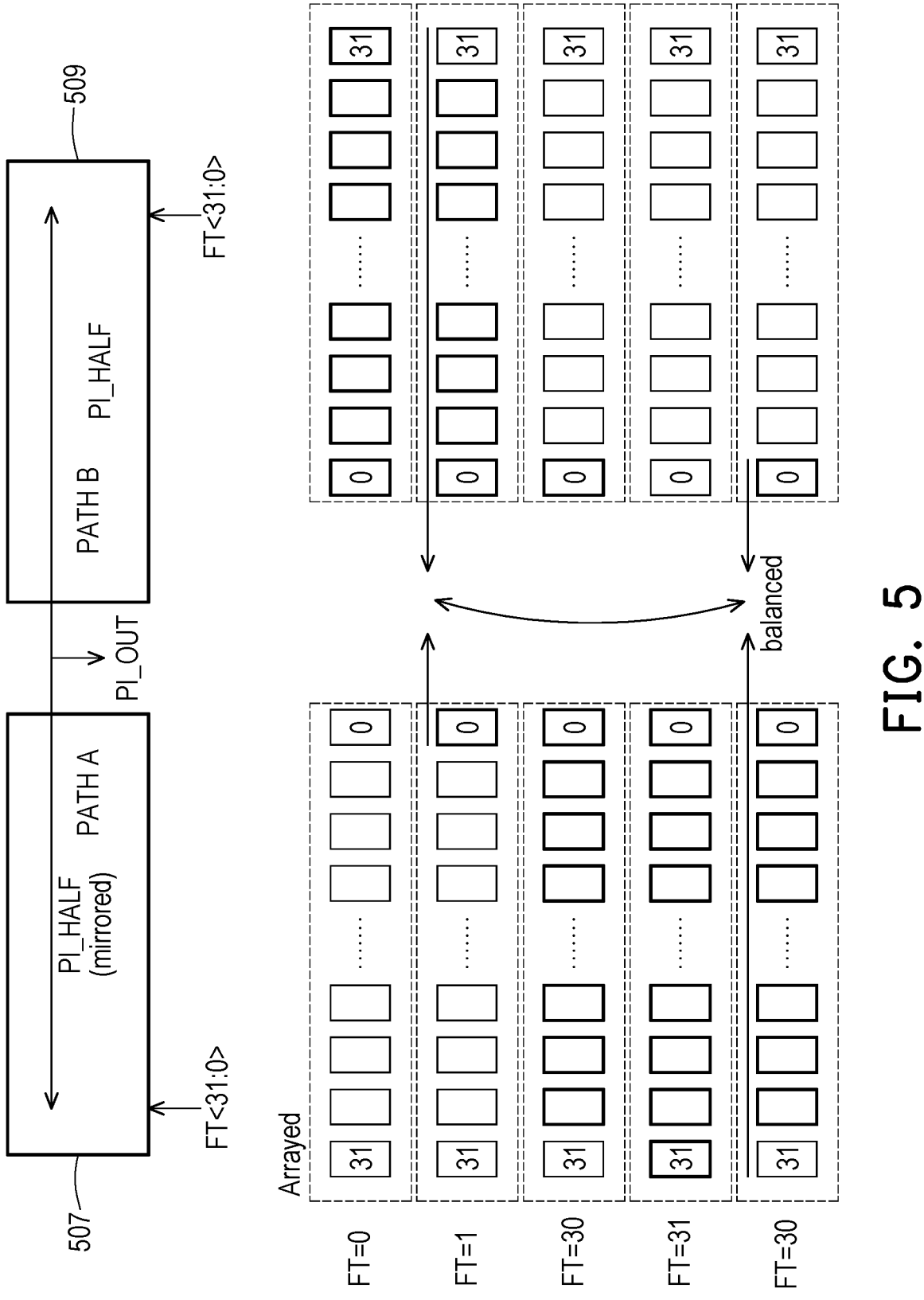
FIG. 5 is a schematic diagram depicting a layout of a phase interpolator according to another embodiment.

FIG. 5 is a schematic diagram depicting a layout of a phase interpolator according to another embodiment. Similar to FIG. 4A described above, the phase interpolator of FIG. 5 may comprise a first functional unit array 507 across Path A and a second functional unit array 509 across Path B. Each functional unit array may comprise an arrangement of a plurality of functional units. The inverter arrays may generate a signal $PI_{OUT}$ based on an input signal and an applied CT code and FT code, which the phase interpolator may then use to generate an output signal Fout having a phase between the phase of a signal input to Path A and a signal input to Path B.

In an embodiment, the phase interpolator may have a mirrored layout, meaning a functional unit 0 of both first array 507 and second array 509 may be disposed toward the center of the phase interpolator. The phase interpolator having a mirrored layout may also incorporate a pin order modification in order to achieve the balanced turn-on resistance described above. In an embodiment, at FT=0, all 32 units along Path A may be on, while all 32 functional units along Path B may be in an off state. At FT=1, a first functional unit along Path B may turn on, and a first functional unit along Path A may turn off. The pin order modification according to embodiments described herein operates such that while functional unit 0 of Path B turns on, functional unit 31 of Path B turns off.

Similarly, in the scenario where FT=30, 31 of the functional units along Path B may be turned on, while just 1 functional unit along Path A is turned on. Rather than the lone functional unit of Path B that is off and the lone functional unit of Path A that is turned on being the same functional unit, the pin order modification allows for functional unit 31 of Path B to be off, while functional unit 0 of Path A is on. This allows the phase interpolator to maintain the symmetrical, balanced turn-on resistance described above, leading to better INL and DNL characteristics.

The encoding scheme described herein may be configured to be monotonic such that any increment in tuning should produce a corresponding increase in phase change. However, in certain disadvantageous conditions, a first change in FT code after a coarse tune change may introduce a non-monotonic phenomenon, which refers to a scenario in which the first increment after a coarse tune change results in a less than desired (or even negative) phase change.

To combat this, phase interpolators according to embodiments described herein may incorporate a bleeder path into the circuit. The bleeder path may comprise an always on functional added to Path A and Path B to add a pull low current path and avoid a situation where differences in DC level between increments results in non-monotonic characteristics.

Figure 6A:
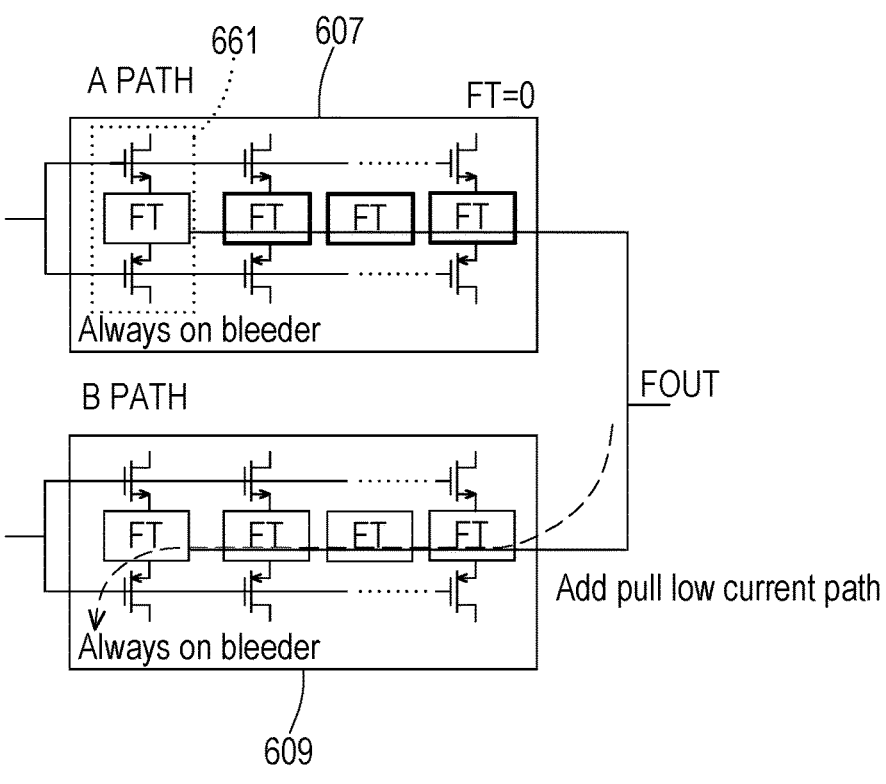
FIG. 6A and FIG. 6B are circuit diagrams depicting a phase interpolator according to an embodiment.
Figure 6B:
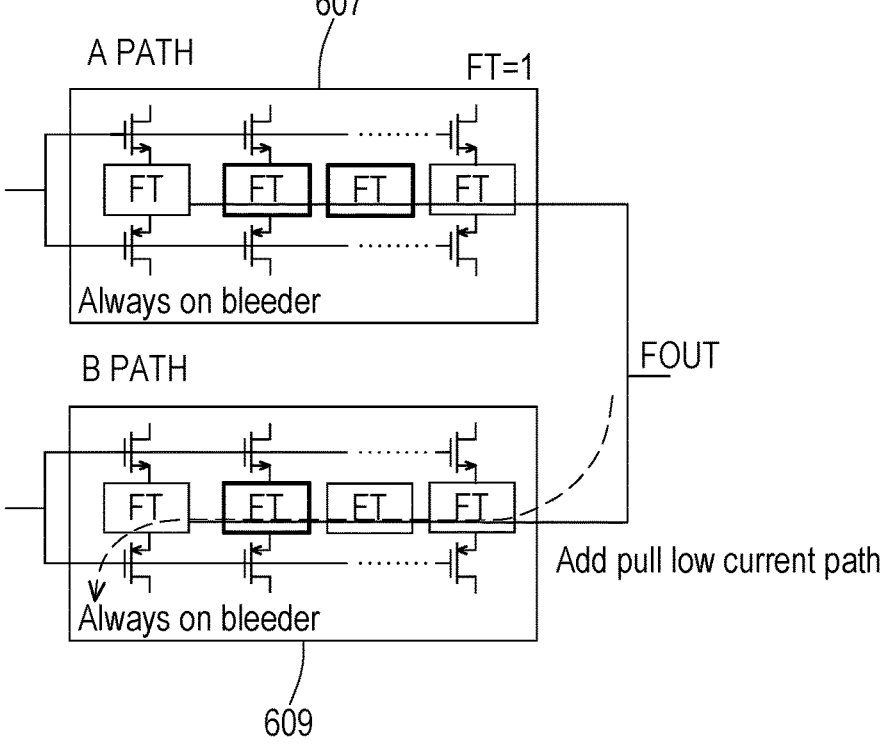

FIGS. 6A and 6B are circuit diagrams depicting a phase interpolator according to an embodiment. In an embodiment, inverter arrays 607 and 609 of a phase interpolator may comprise an always-on functional unit 661 that acts as a bleeder unit. Inverter arrays 607/609 may also be referred to as functional unit arrays and the layout of the circuit depicted in FIGS. 6A and 6B may correspond to the arrayed layout or mirrored layout with pin modification described above with reference to FIG. 4A and FIG. 5. The bleeder 661 unit may add a pull low current path to the phase interpolator. Incorporating bleeder 661 unit may diminish a difference in DC level between adjacent fine tune codes, thereby mitigating the risk of non-monotonic changing.

For example, FIG. 6A is a circuit diagram depicting a phase interpolator incorporating a bleeder path under the condition that FT=0. Under this condition, all functional units along Path B may be in an off state, with the exception of an always on bleeder. FIG. 6B is a circuit diagram depicting the phase interpolator of FIG. 6A under the condition that FT=1. Under this condition, a functional unit along Path B is turned on while a functional unit along Path A is turned off. Incorporating the always on bleeder facilitates the process of turning on this functional unit along Path B due to the presence of the pull low current path introduced by the always on bleeder. Accordingly, the phase interpolator may be characterized by a symmetric DC level condition between switching steps.

In embodiments incorporating a bleeder path, a step size of the first increment after a coarse tune may be dependent upon the strength of the bleeder path. This step may comprise a maximum step size of the encoding scheme. To achieve best performance of the phase interpolator, a ratio of the maximum step size to minimum step size across code changes may be minimized. Accordingly, by tuning the strength of the bleeder path, the step size ratio may be altered and a minimal step size ratio may be achieved. This is described in greater detail below with respect to FIG. 7.

Figure 7:
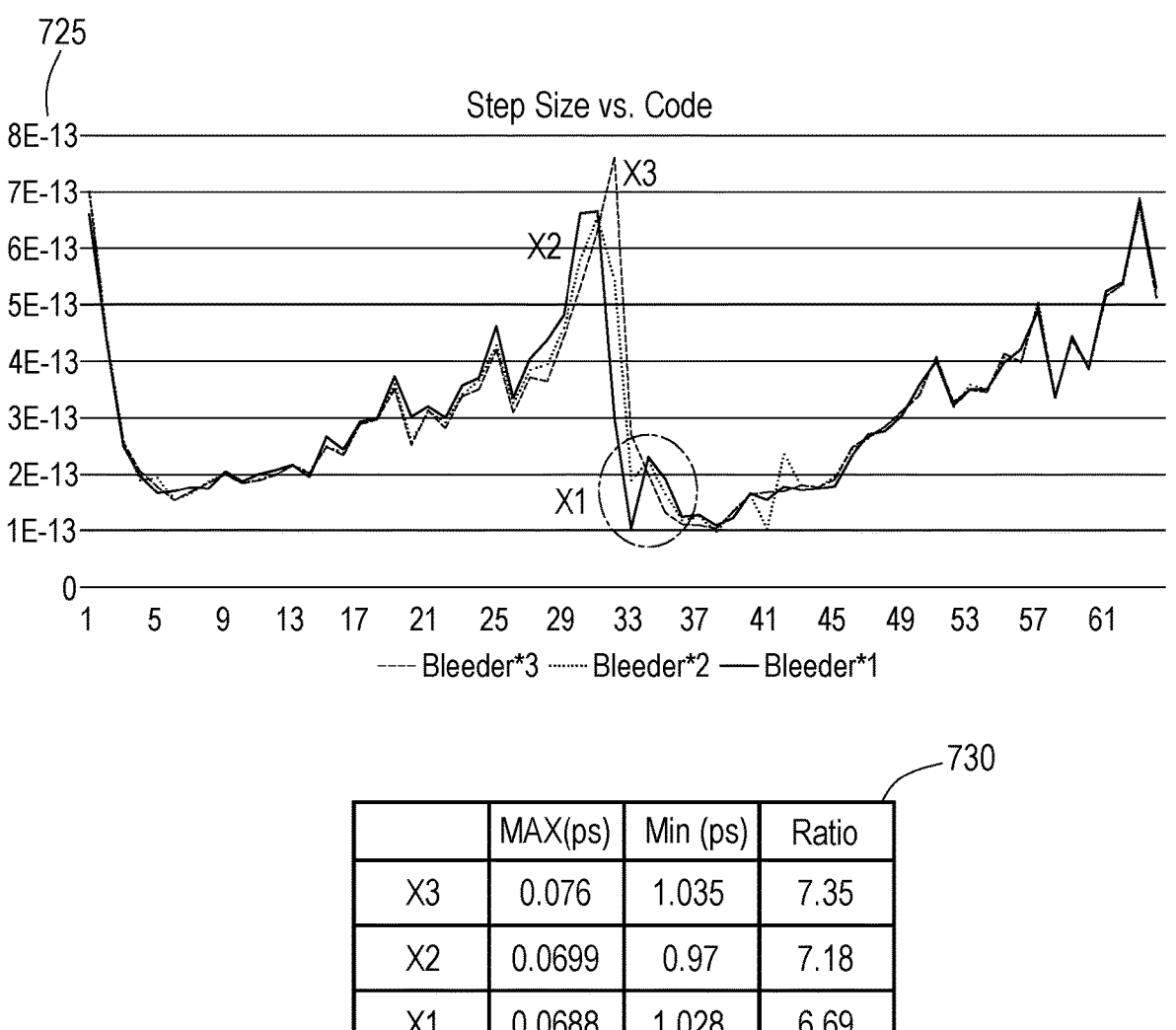
FIG. 7 is a graph depicting the performance of a phase interpolator according to an embodiment.

FIG. 7 is a graph depicting the performance of a phase interpolator according to an embodiment. In particular, graph 725 depicts a step size of a phase interpolator across an encoding scheme according to an embodiment. Graph 725 shows the results of simulating three different bleeder paths of different strengths. The bleeder paths simulated comprise bleeder 1, bleeder 2, and bleeder 3, in order of increasing strength. As shown in graph 725, the stronger the bleeder path, the larger the step size of the first increment after a coarse tune.

In graph 725, X1 may represent the largest size introduced by bleeder 1, X2 may represent the largest step introduced by bleeder 2, and X3 may represent the largest step introduced by bleeder 3. The magnitudes of these step sizes, along with magnitudes of the smallest step introduced by each bleeder are detailed in table 730. For embodiments described herein, a strength of an implemented bleeder may be selected to minimize the step size ratio introduced by the bleeder.

Figure 8:
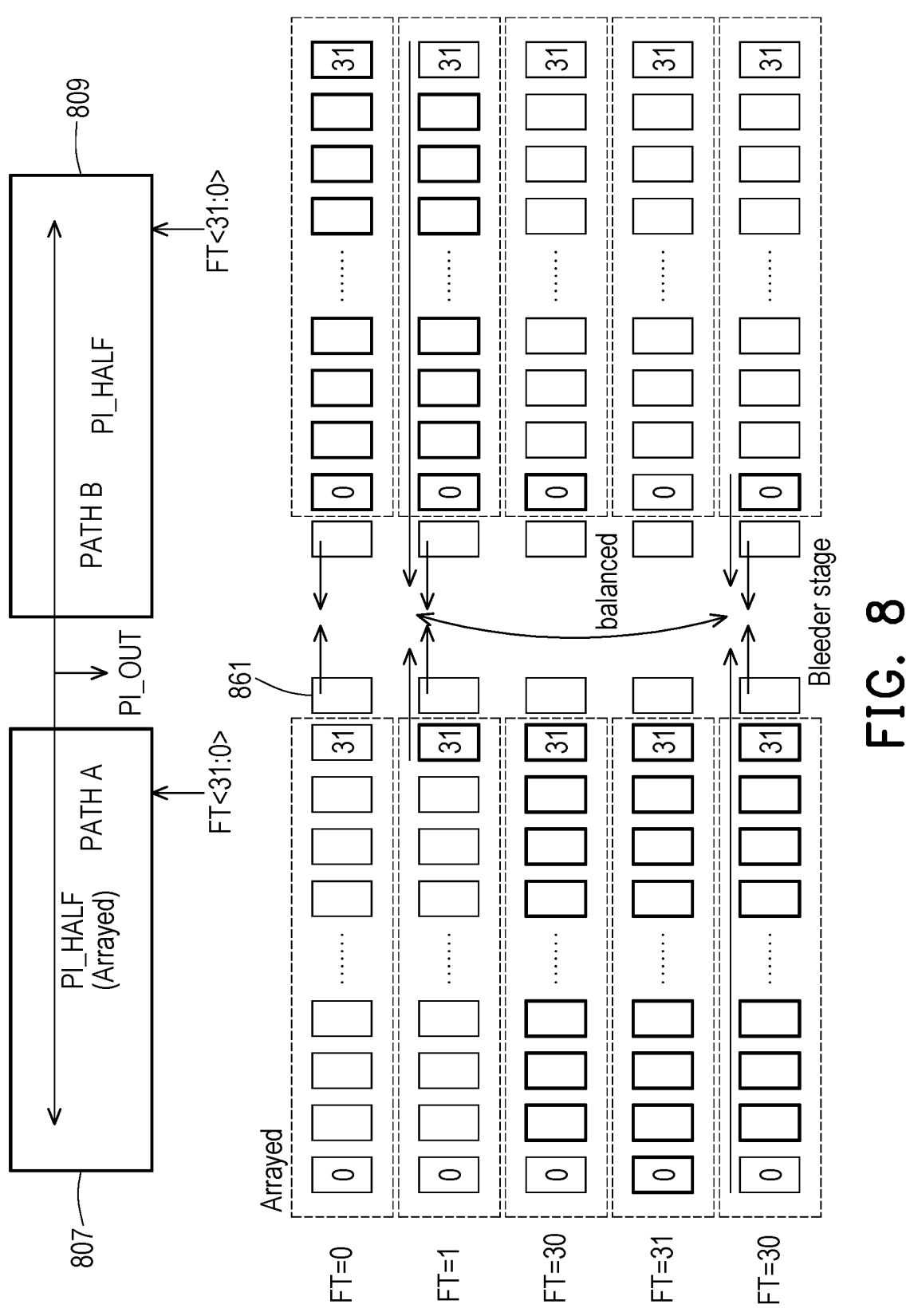
FIG. 8 is a schematic diagram depicting a layout of a phase interpolator according to an embodiment.

FIG. 8 is a schematic diagram depicting a layout of a phase interpolator according to an embodiment. In an embodiment, the phase interpolator may comprise an arrayed layout, as described above with respect to FIG. 4A, and a bleeder path, as described above with respect to FIGS. 6A-6B. For example, a phase interpolator may comprise a first functional unit array 807 along Path A and a second functional unit array 809 along path B. The functional units of the phase interpolator may be arranged in an arrayed layout. The phase interpolator may further comprise a bleeder 861 connected to each path. As described above, the bleeder may comprise a functional unit that is always on. This layout may result in both balanced on-state resistance and may avoid non-monotonic phenomena.

Figure 9:
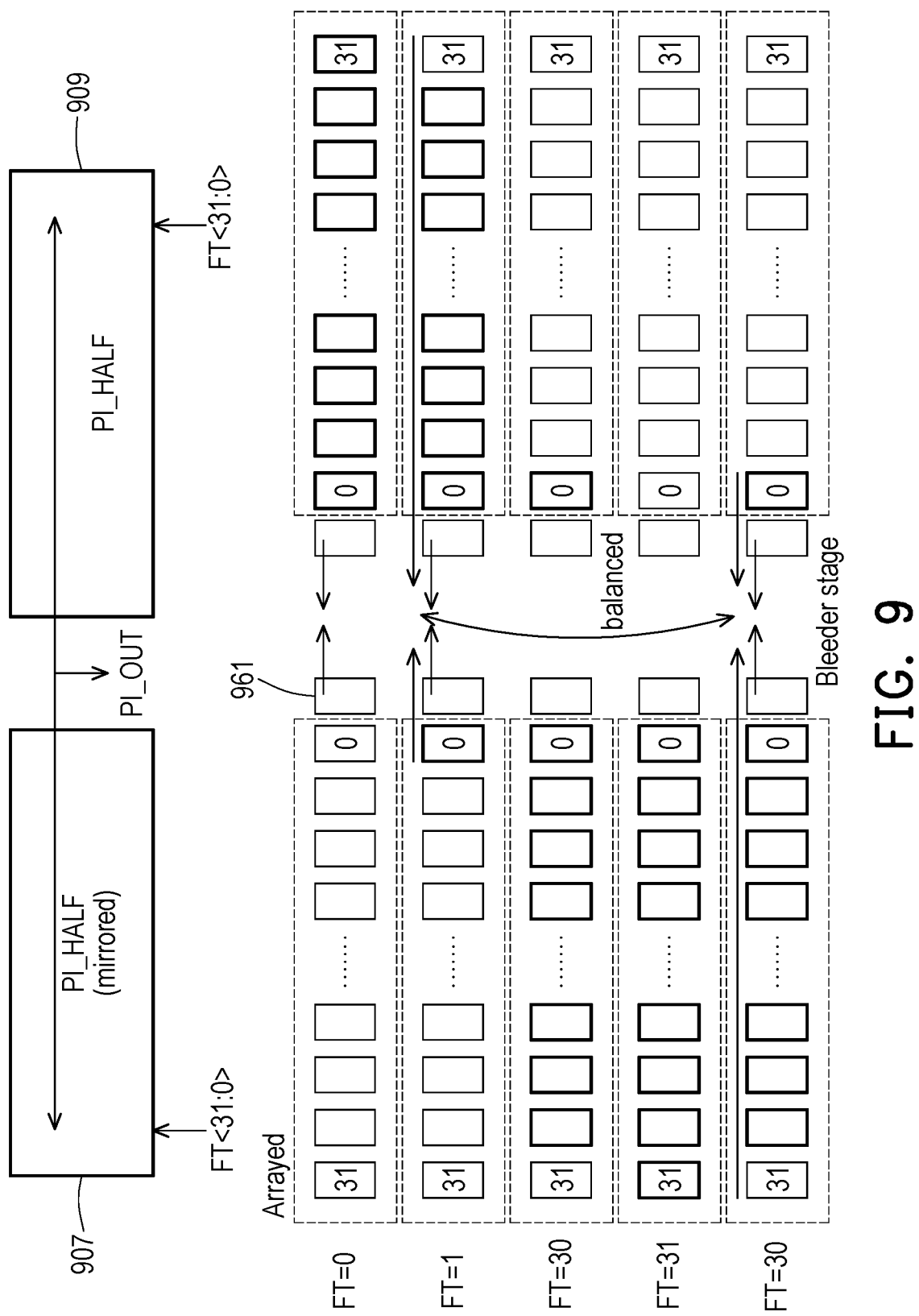
FIG. 9 is a schematic diagram depicting a layout of a phase interpolator according to an embodiment.

FIG. 9 is a layout diagram depicting a phase interpolator according to an embodiment. In an embodiment, the phase interpolator may comprise a mirrored layout with pin modification as described above with respect to FIG. 5 and a bleeder path. For example, a phase interpolator may comprise a first functional unit array 907 along Path A and a second functional unit array 909 along path B. The functional units of the phase interpolator may be arranged in an mirrored layout with a pin modification. The phase interpolator may further comprise a bleeder 961 connected to each path. As described above, the bleeder may comprise a functional unit that is always on. This layout may result in both balanced on-state resistance and may avoid non-monotonic phenomena.

Figure 10:
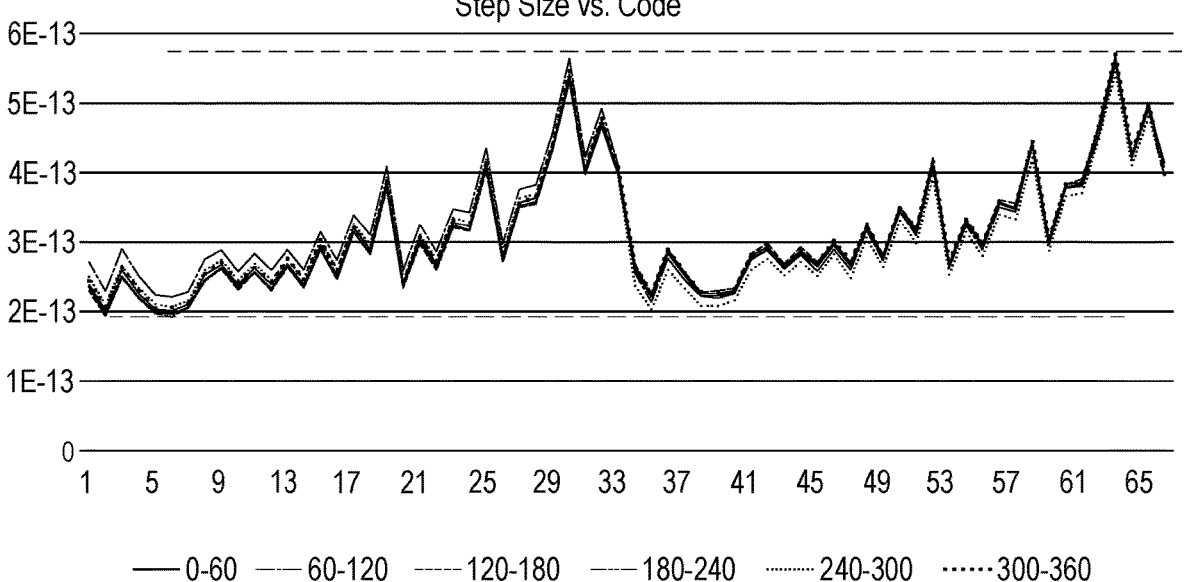
FIG. 10 is a graph depicting simulation results of a phase interpolator according to an embodiment.

FIG. 10 is a graph depicting simulation results of a phase interpolator according to an embodiment. Graph 1001 depicts results of a simulation preformed for a phase interpolator comprising an arrayed floor plan and a bleeder path. The simulation shows results for phase shifts between 0 and 360 degrees. The results may indicate that such a phase interpolator may achieve symmetric step sizing and avoid non-monotonic phenomena.

As described above, in some embodiments, layouts of phase interpolators described herein may be generated using electronic tools or systems. For example, a method of fabricating phase interpolators as described herein may comprise designing a layout using such tools or systems and fabricating a circuit or device based upon the designed layout. Methods of designing circuits or devices incorporating a phase interpolator according to embodiments described herein may be enacted using computer systems, as described in greater detail below.

Figure 11A:
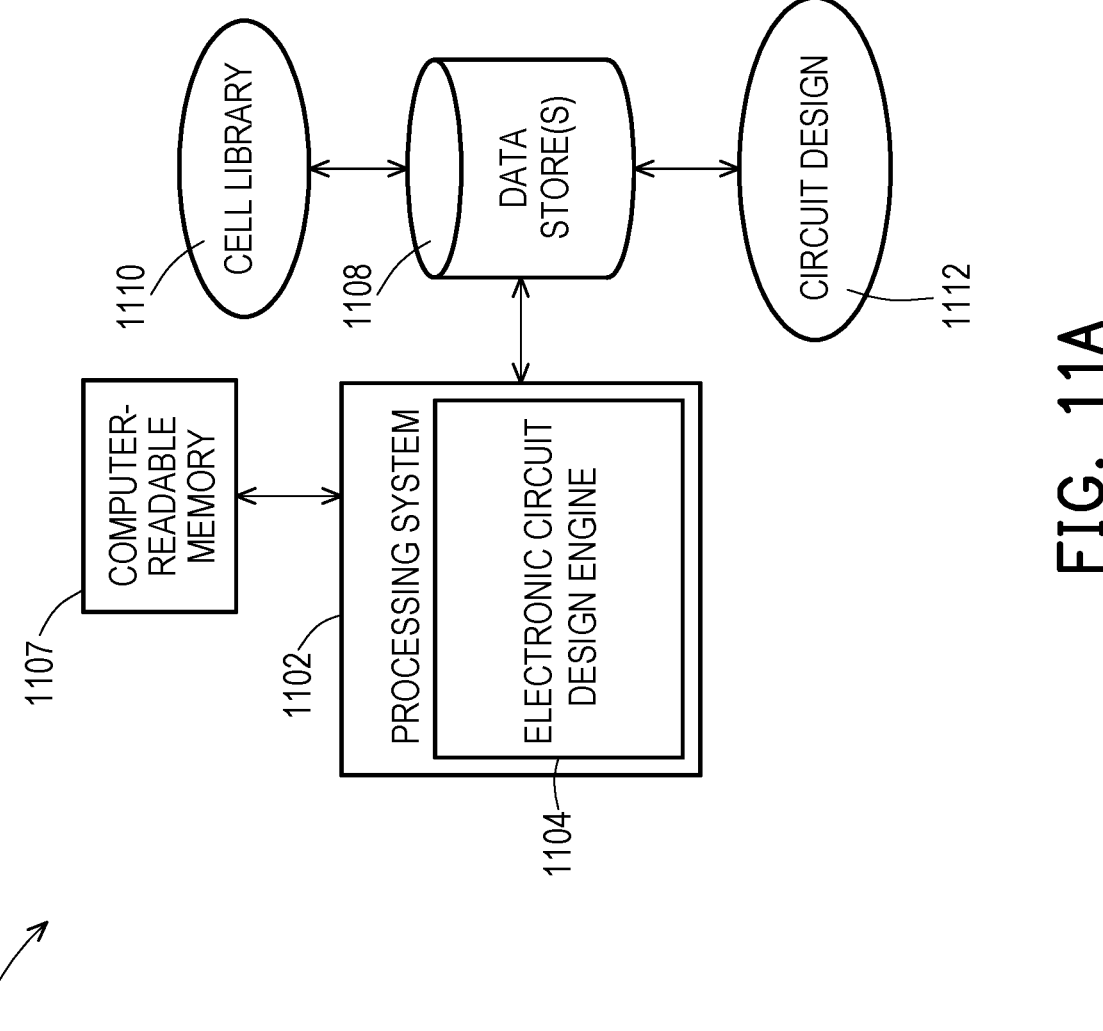
FIGS. 11A, 11B, and 11C are block diagrams depicting example systems for implementing approaches described herein for designing integrated circuits.
Figure 11B:
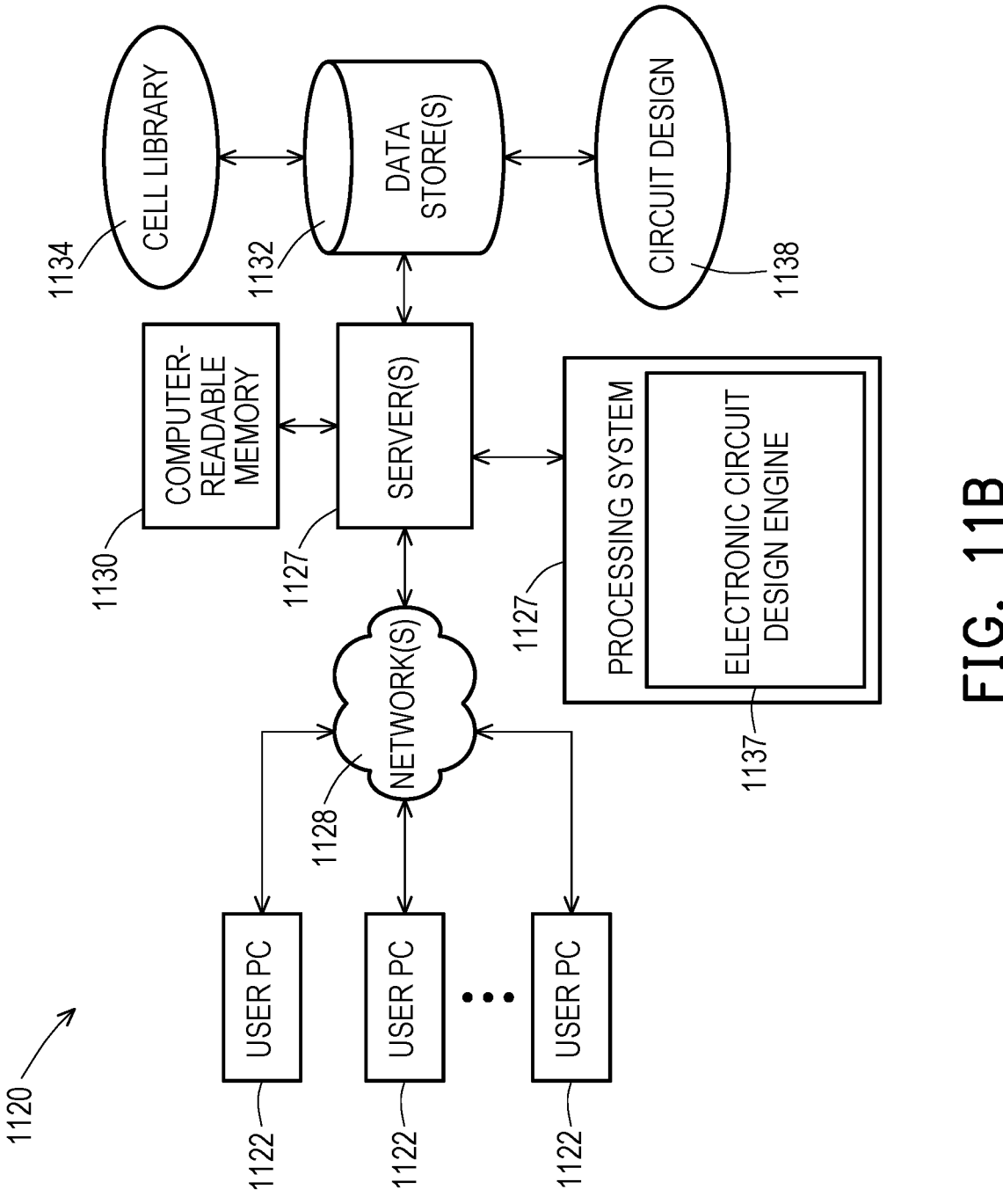
Figure 11C:
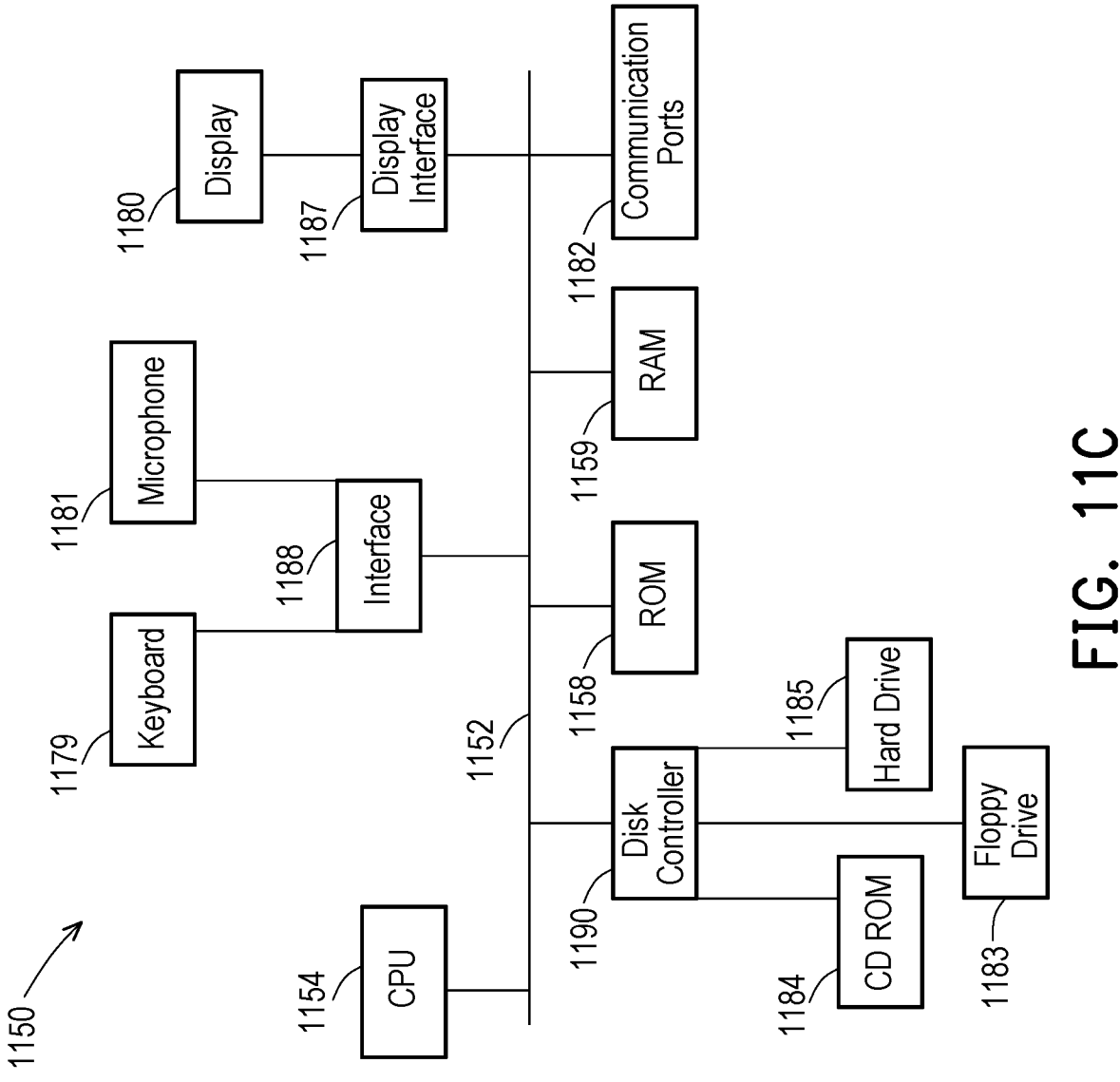

FIGS. 11A, 11B, and 11C depict example systems for implementing the approaches described herein for designing said layouts and for generating and fabricating circuits and devices based on said layouts. For example, FIG. 11A depicts an exemplary system 1100 that includes a standalone computer architecture where a processing system 1102 (e.g., one or more computer processors located in a given computer or in multiple computers that may be separate and distinct from one another) includes a computer-implemented electronic circuit design engine 1104 being executed on the processing system 1102. The processing system 1102 has access to a computer-readable memory 1107 in addition to one or more data stores 1108. The one or more processors of processing system 1102 may be in communication with the computer-readable memory 1107 which may store instructions that, when executed, command the one or more processors to execute the operations of the methods described herein. The one or more data stores 1108 may include a cell library database 1110 as well as a circuit design database 1112. In an embodiment, cell library database 1110 may comprise an analog cell library. The processing system 1102 may be a distributed parallel computing environment, which may be used to handle very large-scale data sets.

FIG. 11B depicts a system 1120 that includes a client-server architecture. One or more user PCs 1122 access one or more servers 1124 running an electronic circuit design engine 1137 on a processing system 1127 via one or more networks 1128. The one or more servers 1124 may access a computer-readable memory 1130 as well as one or more data stores 1132. The one or more data stores 1132 may include a cell library database 1134 as well as a circuit design database 1138.

FIG. 11C shows a block diagram of exemplary hardware for a standalone computer architecture 1150, such as the architecture depicted in FIG. 11A that may be used to include and/or implement the program instructions of system embodiments of the present disclosure. A bus 1152 may serve as the information highway interconnecting the other illustrated components of the hardware. A processing system 1154 labeled CPU (central processing unit) (e.g., one or more computer processors at a given computer or at multiple computers), may perform calculations and logic operations required to execute a program. A non-transitory processor-readable storage medium, such as read only memory (ROM) 1158 and random-access memory (RAM) 1159, may be in communication with the processing system 1154 and may include one or more programming instructions for performing the method of designing an integrated circuit. Program instructions may be stored on a non-transitory computer-readable storage medium such as a magnetic disk, optical disk, recordable memory device, flash memory, or other physical storage medium.

In FIGS. 11A, 11B, and 11C, computer readable memories 1107, 1130, 1158, 1159 or data stores 1108, 1132, 1183, 1184, 1188 may include one or more data structures for storing and associating various data used in the example systems for designing an integrated circuit. For example, a data structure stored in any of the aforementioned locations may be used to store data from XML files, initial parameters, and/or data for other variables described herein. A disk controller 1190 interfaces one or more optional disk drives to the system bus 1152. These disk drives may be external or internal floppy disk drives such as 1183, external or internal CD-ROM, CD-R, CD-RW, or DVD drives such as 1184, or external or internal hard drives 1185. In addition to physical drives, the system bus 1152 may be in communication with cloud-based virtual drives. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 1190, the ROM 1158 and/or the RAM 1159. The processor 1154 may access one or more components as required. A display interface 1187 may permit information from the bus 1152 to be displayed on a display 1180 in audio, graphic, or alphanumeric format. Communication with external devices may optionally occur using various communication ports 1182. In addition to these computer-type components, the hardware may also include data input devices, such as a keyboard 1179, or other input device 1181, such as a microphone, remote control, pointer, mouse and/or joystick.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein and may be provided in any suitable language such as C, C++, JAVA, for example, or any other suitable programming language. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

Figure 12:
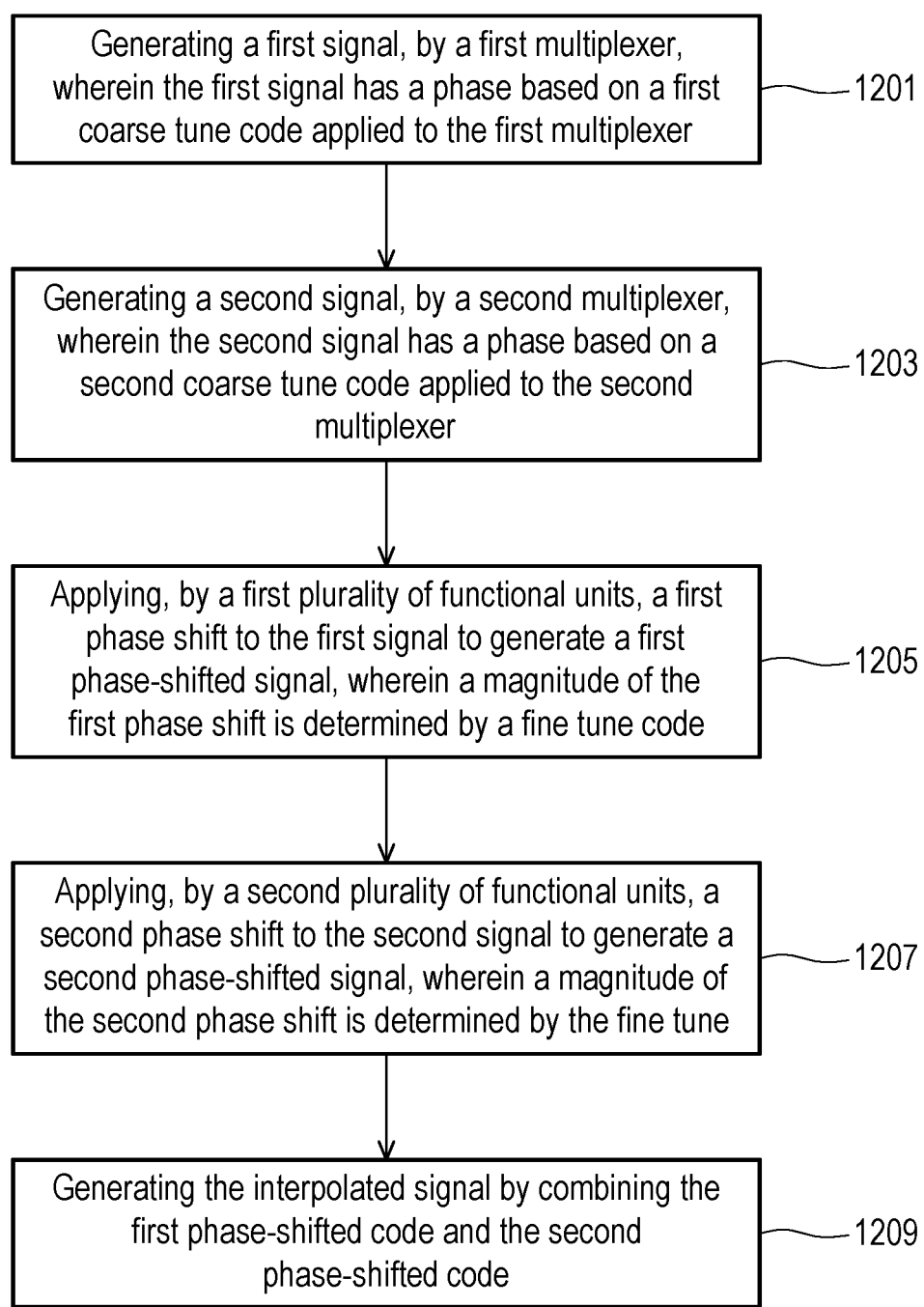
FIG. 12 is a flowchart depicting a method of generated an interpolated signal according to an embodiment.

FIG. 12 is a flowchart depicting a method of generating an interpolated signal according to an embodiment. As shown at 1201, the method may comprise a first multiplexer generating a first signal having a phase shift based on a first coarse tune code applied to the first multiplexer. For example, as shown in FIG. 2B, the first CT code may comprise the 000 code which results in the multiplexer taking an input signal and generating an output signal without any phase shift.

At 1203, the method may further comprise a second multiplexer generating a second signal having a phase based on a second coarse tune code applied to the second multiplexer. In an embodiment, the second coarse tune code may comprise the same code as the first coarse tune code. For example, as described above with reference to FIGS. 2A and 2B, a CT code of 000 may be applied to both MUXA and MUXB. This may result in MUXA imparting a 0 degree phase shift to an input signal and MUXB imparting a 30 degree phase shift to an input signal. In other embodiments, the second coarse tune code may be different from the first coarse tune code. For example, to impart a phase shift between 30 degrees and 60 degrees to an input signal, methods described herein may comprise applying a CT code of 001 to MUXA and a CT code of 000 to MUXB.

At 1205, the method may further comprise applying a first phase shift to the first signal by passing the first signal through a first plurality of functional units. In doing so, a first phase-shifted signal may be generated. The first plurality of functional units may comprise an array of functional units comprising inverters as described in the embodiments set forth above. A fine tune code applied to this array may determine the magnitude of the phase shift.

At 1207, the method may further comprise applying a second phase shift to the second signal by passing the second signal through a second plurality of functional units. In doing so, a second phase-shifted signal may be generated. The second plurality of functional units may comprise an array of functional units comprising inverters as described in the embodiments set forth above. The fine tune code applied to this array may determine the magnitude of the phase shift. As described above with reference to FIGS. 4A and 4B, the first array and the second array may be arranged in a layout such that turn-on resistances across the arrays certain fine tune increments.

At 1209, an interpolated signal may be generated by combining the first phase-shifted signal and the second phase-shifted signal. For example, the first phase-shifted signal may be traveling a first path, Path A, while the second phase-shifted signal may be traveling along a second path, Path B. As shown in, for example, FIG. 2A, Path A and Path B may join and the signals traveling along each path may combine to form an interpolated signal. This interpolated signal may comprise a phase that lies between a phase of the first signal and a phase of the second signal.

By controlling the coarse tune adjustments and phase tune adjustments, and incorporating the turn-on resistance balancing and/or bleeder paths of the embodiments described herein, a phase interpolator may be capable of generating highly accurate and evenly spaced interpolated signals at even intervals between a 0 degree phase shift and a 360 degree phase shift of an input signal. This may result in increased INL and DNL characteristics allowing for more accurate clock and data recovery.

Circuits, methods, and devices are described herein. In an example circuit, a first multiplexer is configured to output a first signal along a first path and a second multiplexer configured to output a second signal along a second path. The first multiplexer and second multiplexer are configured to receive a coarse tune signal for controlling a phase of the first signal and a phase of the second signal. The circuit further comprises a first plurality of functional units connected along the first path, wherein the first plurality of functional units is configured to take the first signal as input and output a first phase-shifted signal, and a second plurality of functional units connected along the second path, wherein the second plurality of functional units is configured to take the second signal as input and output a second phase-shifted signal. In the circuit, the first plurality of functional units and the second plurality of functional units are configured to receive a fine tune signal that is configured to control a first number of functional units of the first plurality of functional units in an on state and a second number of functional units of the second plurality of functional units in an on state, and the first path and the second path intersect such that the first phase-shifted signal and the second phase-shifted signal combine to form an interpolated signal comprising a phase between the phase of the first signal and the phase of the second signal.

In an example device, a sampler, a digital filter, a controller, and a phase interpolator are provided. The sampler is configured to receive an input data signal, the digital filter is configured to receive sampled signals from the sample, the controller is configured to generate control signals based on filtered signals received form the digital filter, and the phase interpolator is configured to receive control signals form the controller and clock signals from a reference loop and output an interpolated signal. The phase interpolator comprises an array of functional units, wherein the array of functional units is divided into a first half and a second half each comprising a same number of functional units, the phase interpolator is further configured to balance a turn-on resistance across the functional units of the first half in response to a first fine tune code with a turn-on resistance across the functional units of the second half in response to a second fine tune code.

In an example method, an interpolated signal is generated. The method comprises generating, by generating a first signal, by a first multiplexer, wherein the first signal has a phase based on a first coarse tune code applied to the first multiplexer. A second signal is also generated by a second multiplexer and the second signal is based on a second coarse tune code applied to the second multiplexer. A first plurality of functional units apply a first phase shift to the first signal to generate a first phase-shifted signal, and a magnitude of the first phase shift is determined by a fine tune code. A second plurality of functional units applies a second phase shift to the second signal to generate a second phase-shifted signal, and a magnitude of the second phase shift is determined by the fine tune. The interpolated signal is then output by combining the first phase-shifted code and the second phase-shifted code.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A circuit comprising:

a first multiplexer configured to output a first signal along a first path and a second multiplexer configured to output a second signal along a second path, wherein the first multiplexer and second multiplexer are each configured to receive a coarse tune signal for controlling a phase of the first signal and a phase of the second signal;

a first plurality of functional units connected along the first path, wherein the first plurality of functional units is configured to take the first signal as input and output a first phase-shifted signal; and a second plurality of functional units connected along the second path, wherein the second plurality of functional units is configured to take the second signal as input and output a second phase-shifted signal, wherein the first plurality of functional units and the second plurality of functional units are configured to receive a fine tune signal that is configured to control a first number of functional units of the first plurality of functional units in an on-state and a second number of functional units of the second plurality of functional units in an on-state, and wherein the first path and the second path intersect such that the first phase-shifted signal and the second phase-shifted signal combine to form an interpolated signal comprising a phase between the phase of the first signal and the phase of the second signal.

2. The circuit of claim 1, further comprising an output inverter configured to receive the interpolated signal as input and generate an output signal.

3. The circuit of claim 1, wherein each functional unit of the first plurality of functional units and the second plurality of functional units comprises an inverter.

4. The circuit of claim 1, wherein the first plurality of functional units and the second plurality of functional units comprise a same number of functional units.

5. The circuit of claim 4, wherein the first plurality of functional units are arranged in a first array; and the second plurality of functional units are arranged in a second array.

6. The circuit of claim 5, wherein the first plurality of functional units and the second plurality of functional units comprise an arrayed layout.

7. The circuit of claim 6, further comprising a bleeder path introduced by an always-on bleeder unit.

8. The circuit of claim 5, wherein the first plurality of functional units and the second plurality of functional units comprise a mirrored layout with a pin order modification.

9. The circuit of claim 8, further comprising a bleeder path introduced by an always-on bleeder unit.

10. The circuit of claim 5, wherein the first plurality of functional units is configured such that a first code of the fine tune signal turns on a single functional unit of the first plurality of functional units;

the second plurality of functional units is configured such that the first code of the fine tune signal turns on all but a single functional unit of the second plurality of functional units; and the first plurality of functional units and second plurality of functional units are arranged such that the single functional unit of the first plurality of functional units is in a first position within the first array and the single functional unit of the second plurality of functional units is in a corresponding position of the second array.

11. The circuit of claim 1, wherein the first plurality of functional units is configured such that a first code of the fine tune signal turns on a single functional unit of the first plurality of functional units and a second code of the fine tune signal turns on all but one functional unit of the first plurality of functional units;

the second plurality of functional units is configured such that the first code of the fine tune signal turns on all but one functional unit of the second plurality of functional units and the second code of the fine tune signal turns on a single functional unit of the plurality of functional units, wherein a turn-on resistance across the first plurality of functional units in response to the first code of the fine tune signal is equal to a turn-on resistance across the second plurality of functional units in response to the second code of the fine tune signal.

12. The circuit of claim 11, wherein a turn-on resistance across the first plurality of functional units in response to the second code of the fine tune signal is equal to a turn-on resistance across the second plurality of functional units in response to the first code of the fine tune signal.

13. The circuit of claim 1, wherein the circuit further comprises a first bleeder path configured to introduce a pull low current path across the first plurality of functional units.

14. The circuit of claim 1, wherein the first plurality of functional units comprises an always-on bleeder unit.

15. An integrated circuit device comprising:

a sampler configured to receive an input data signal;

a digital filter configured to receive sampled signals from the sampler;

a controller configured to generate control signals based on filtered signals received from the digital filter; and a phase interpolator configured to receive control signals from the controller and clock signals from a reference loop and output an interpolated signal, wherein the phase interpolator comprising an array of functional units, wherein the array of functional units is divided into a first half and a second half each comprising a same number of functional units, and wherein the phase interpolator is configured to balance a turn-on resistance across the functional units of the first half in response to a first fine tune code with a turn-on resistance across the functional units of the second half in response to a second fine tune code.

16. The device of claim 15, wherein the phase interpolator comprises a plurality of multiplexers and the plurality of functional units comprise inverters.

17. The device of claim 16, wherein the phase interpolator comprises a bleeder path.

18. A method of generating an interpolated signal comprising:

generating a first signal, by a first multiplexer, wherein the first signal has a phase based on a first coarse tune code applied to the first multiplexer;

generating a second signal, by a second multiplexer, wherein the second signal has a phase based on a second coarse tune code applied to the second multiplexer;

applying, by a first plurality of functional units, a first phase shift to the first signal to generate a first phase-shifted signal, wherein a magnitude of the first phase shift is determined by a fine tune code;

applying, by a second plurality of functional units, a second phase shift to the second signal to generate a second phase-shifted signal, wherein a magnitude of the second phase shift is determined by the fine tune code; and generating the interpolated signal by combining the first phase-shifted signal and the second phase-shifted signal.

19. The method of claim 18, further comprising inverting the interpolated signal to generate an output signal.

20. The method of claim 18, wherein the first plurality of functional units and the second plurality of functional units each comprise N number of functional unit;

the first plurality of functional units and second plurality of functional units are configured such that the fine tune code results in A number of functional units of the first plurality of functional units being in an on-state and B number of functional units of the second plurality of functional units being in an on-state; and wherein A+B=N.

* * * * *